(12) United States Patent
Lizenberg et al.

(10) Patent No.: US 7,699,933 B2
(45) Date of Patent: Apr. 20, 2010

(54) METHOD AND DEVICE FOR THE PLASMA TREATMENT OF WORKPIECES

(75) Inventors: Michael Lizenberg, Geesthacht (DE); Frank Lewis, Tangstedt (DE); Hartwig Müller, Lütjensee (DE); Klaus Vogel, Barsbüttel (DE); Gregor Arnold, Bodenheim (DE); Stephan Behle, Hahnheim (DE); Andreas Lüttringhaus-Henkel, Darmstadt (DE); Matthias Bicker, Mainz (DE); Jürgen Klein, Mainz (DE)

(73) Assignee: KHS Corpoplast GmbH & Co. KG, Hamburg (DE)

( * ) Notice: Subject to any disclaimer, the term of this patent is extended or adjusted under 35 U.S.C. 154(b) by 809 days.

(21) Appl. No.: 10/515,609

(22) PCT Filed: May 9, 2003

(86) PCT No.: PCT/DE03/01506

§ 371 (c)(1),
(2), (4) Date: May 31, 2005

(87) PCT Pub. No.: WO03/100127

PCT Pub. Date: Dec. 4, 2003

(65) Prior Publication Data

US 2005/0227002 A1    Oct. 13, 2005

(30) Foreign Application Priority Data

May 24, 2002  (DE) ................................ 102 23 288
Jun. 11, 2002  (DE) ................................ 102 25 985

(51) Int. Cl.
*C23C 16/00*    (2006.01)
*B05D 7/22*    (2006.01)

(52) U.S. Cl. .................... 118/719; 118/718; 118/723 R; 204/298.28; 204/298.35; 422/186.05

(58) Field of Classification Search ........................ None
See application file for complete search history.

(56) References Cited

U.S. PATENT DOCUMENTS

| 4,747,689 | A  | * | 5/1988  | Aldred .......................... 356/638 |
| 5,627,105 | A  | * | 5/1997  | Delfino et al. .............. 438/627 |
| 6,265,690 | B1 | * | 7/2001  | Fornsel et al. ............ 219/121.5 |
| 6,294,226 | B1 | * | 9/2001  | Shimamura ................. 427/577 |
| 6,328,805 | B1 | * | 12/2001 | Rius ........................... 118/715 |
| 6,488,889 | B1 | * | 12/2002 | Stahlecker et al. ............ 422/22 |

(Continued)

FOREIGN PATENT DOCUMENTS

EP           1 010 773        6/2000

(Continued)

*Primary Examiner*—Michael Cleveland
*Assistant Examiner*—Nathan K Ford
(74) *Attorney, Agent, or Firm*—Friedrich Kueffner

(57) ABSTRACT

The invention relates to a method and a device which are used for the plasma treatment of work pieces. Said work piece is inserted into an at least partially evacuable chamber of a treatment station (3) and the work piece is positioned inside the treatment station of retaining elements. At least one operating agent is at least partially impinged upon by a transporting device (44) which is displaced together with the treatment station on a closed and rotating transport path.

21 Claims, 14 Drawing Sheets

U.S. PATENT DOCUMENTS 6,818,068 B1 * 11/2004 Guiffant et al. ............. 118/719
2004/0099214 A1 * 5/2004 Hama et al. .............. 118/723 E

FOREIGN PATENT DOCUMENTS

| WO | 95/22413 | 8/1995 |
| WO | 99/17334 | 4/1999 |
| WO | 00/58631 | 10/2000 |
| WO | 01/31680 | 5/2001 |

* cited by examiner

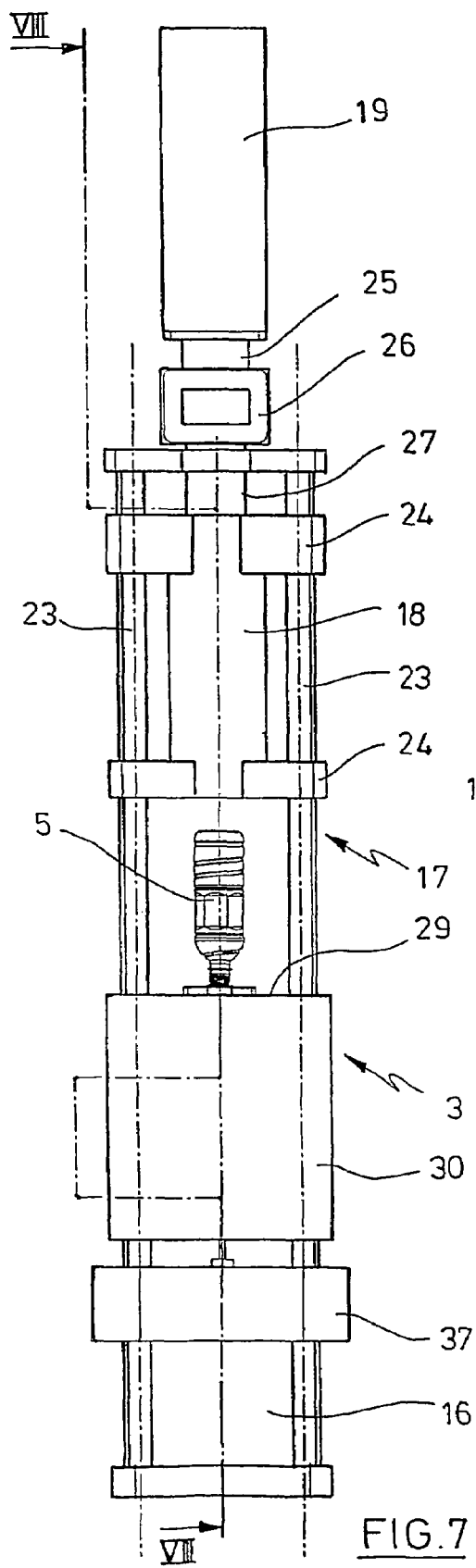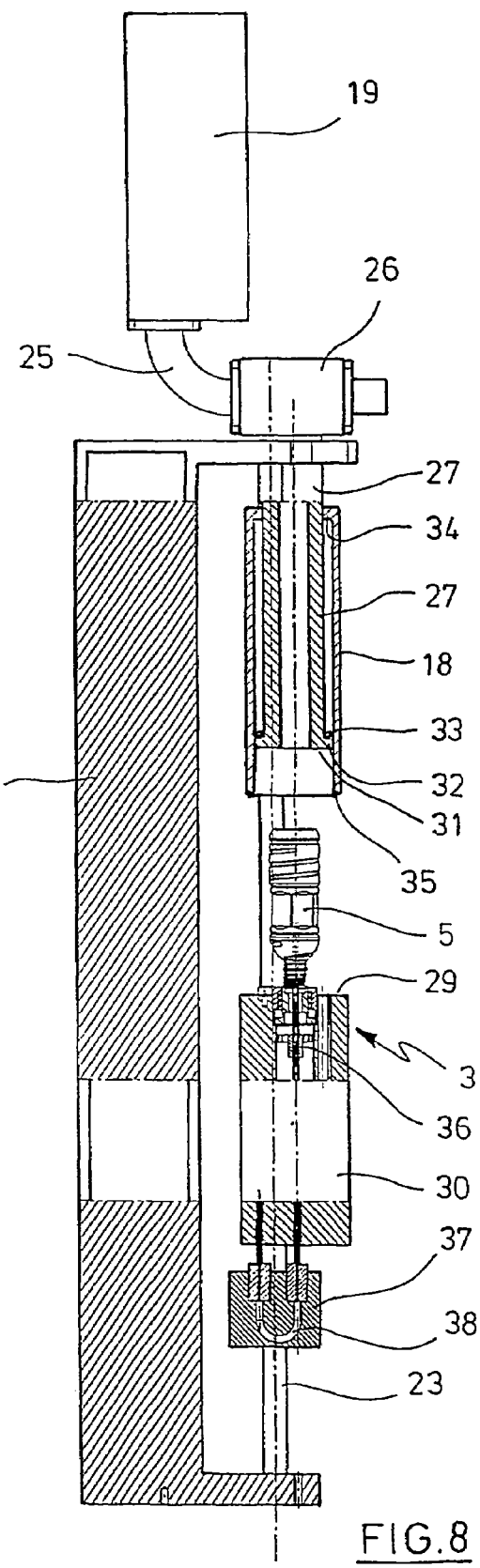

METHOD AND DEVICE FOR THE PLASMA TREATMENT OF WORKPIECES

The invention concerns a method for the plasma treatment of workpieces, wherein the workpiece is inserted in a plasma chamber of a treatment station, which can be at least partially evacuated, and wherein the workpiece is positioned inside the treatment station by a mounting element.

The invention also concerns a device for the plasma treatment of workpieces, which has at least one plasma chamber, which can be evacuated, for holding the workpieces, in which the plasma chamber is located in the area of a treatment station, and in which the plasma chamber is bounded by a chamber floor, a chamber lid and a lateral chamber wall and has at least one mounting element for positioning the workpiece.

Processes and devices of this type are used, for example, to apply surface coatings to plastics. In particular, processes and devices of this type are also already known for coating inner or outer surfaces of containers used for holding liquids. Devices for plasma sterilization are also well known.

PCT-WO 95/22413 describes a plasma chamber for coating the inner surface of PET bottles. The bottles to be coated are raised into a plasma chamber by a movable base and connected at their mouths to an adapter. The inside of the bottles can be evacuated through the adapter. A hollow lance for supplying process gas is also inserted into the inside of the bottles through the adapter. Microwaves are used to ignite the plasma.

The same publication also describes the arrangement of a plurality of plasma chambers on a rotating wheel. This helps achieve a high production rate of bottles per unit time.

EP-OS 10 10 773 describes a feeding device for evacuating the inside of a bottle and supplying it with process gas. PCT-WO 01/31680 describes a plasma chamber into which the bottles are introduced by a movable lid that has first been connected with the mouths of the bottles.

PCT-WO 00/58631 also already describes the arrangement of plasma stations on a rotating wheel and the assignment of groups of vacuum pumps and plasma stations for an arrangement of this type to help provide favorable evacuation of the chambers and the interiors of the bottles. It also mentions the coating of several containers in a common plasma station or a common cavity.

Another system for coating the inside surfaces of bottles is described in PCT-WO 99/17334. This document describes especially an arrangement of a microwave generator above the plasma chamber and means for evacuating the plasma chamber and supplying it with operating agents through the floor of the plasma chamber.

In most of the previously known methods, silicon oxide coatings, which have the general chemical formula $SiO_x$ and are produced by the plasma, are used to improve the barrier properties of the thermoplastic material. In addition, barrier layers produced in this way can also contain carbon, hydrogen, and nitrogen components. Barrier layers of this type prevent oxygen from penetrating the bottled liquids and prevent the escape of carbon dioxide from liquids that contain $CO_2$.

The previously known methods and devices are still not sufficiently suitable for use in a mass-production process, in which it is necessary to achieve both a low coating cost per workpiece and a high production rate.

Therefore, the objective of the present invention is to develop a method of the aforementioned type in such a way that the operating agents can be effectively supplied to the treatment station, and a compact construction, short process idle times and a high degree of reliability can be achieved at the same time.

In accordance with the invention, this objective is achieved in such a way that at least one operating agent is admitted at least partially by a delivery device, which is moved together with the treatment station on a closed and rotating transport path.

A further objective of the present invention is to design a device of the aforementioned type that allows operating agents to be supplied to the plasma chamber and to achieve a compact construction at the same time.

In accordance with the invention, this objective is achieved by arranging the plasma chamber and at least one delivery device for an operating agent on a rotating support device.

The common arrangement of the plasma chamber and the delivery device for the operating agents on a rotating support device makes it possible to supply the operating agents in the necessary form in the immediate vicinity of the plasma chamber. This helps achieve a compact design, and, in addition, very short connecting lines can be used. Furthermore, flow losses along long lines are eliminated by the spatially dense arrangement of the delivery device and the plasma chamber relative to each other, so that short process idle times are achieved.

The physical conditions necessary for the plasma treatment can be quickly reached if the delivery device produces a negative pressure.

Rapid evacuation can also be achieved if at least two different negative pressures are produced by at least two delivery devices.

A good compromise between a low weight to be transported and the supplying of the operating agents with little or no time delay is obtained if a preconditioned operating agent is supplied for at least one delivery device by at least one preliminary stage.

Stationary and moving components can be connected by conveying the operating agents to the vicinity of the delivery device through a revolving turret.

Advantageous positioning of the center of mass can be achieved if the delivery device conveys the operating agents from a height level of the delivery device to a higher level of the plasma station.

To connect a plurality of plasma stations, it is proposed that at least two plasma stations be connected with at least one common delivery device by a distributor.

Operating agents can be supplied through short connecting lines if at least one operating agent is distributed by at least one distributor at a height level of a chamber base of the plasma station.

In particular, it is also possible for the operating agents to be supplied by the distributor in the direction of the plasma stations through connecting lines that are straight and run radially outward from the distributor.

Compact distribution of different operating agents is assisted by conveying at least two operating agents to the plasma stations at different distribution levels.

When rotating support devices are used, it is found to be especially advantageous if the delivery devices are arranged in the area of the support device in such a way that an essentially balanced weight distribution is provided.

A combination of a favorable weight distribution and good accessibility can be achieved by positioning delivery devices and distribution cabinets for electrical connections alternately along the circumference of the support device.

A system that is very stable and at the same time supports exactly reproducible performance of all process steps can be achieved by positioning the delivery device together with the plasma station on a rotating plasma wheel as the support device.

A typical application consists in the treatment of a workpiece made of a thermoplastic material.

The method is intended especially for treating the interior of the workpiece.

A large area of application consists in the treatment of containers as the workpieces.

In this regard, it is intended especially that a beverage bottle be treated as the workpiece.

A high production rate with a high degree of reliability and high product quality can be achieved by transferring the one or more plasma stations from an input position to an output position by a rotating plasma wheel.

An increase in production capacity with only a slight increase in equipment expense can be achieved if one plasma station comprises several cavities.

An embodiment that can withstand large mechanical loads is obtained if the delivery devices are conveyed by a plasma wheel with an annular shape.

A typical application is defined as the performance of a plasma coating as the plasma treatment.

It is intended especially that the plasma treatment be carried out with the use of a low-pressure plasma.

In the case of the coating of plastic workpieces, it has been found to be advantageous to carry out a plasma polymerization.

Good surface adhesion is promoted if at least some of the substances deposited by the plasma are organic substances.

Especially advantageous practical properties of workpieces to be used for packaging foods can be obtained if at least some of the substances deposited by the plasma are inorganic substances.

In the treatment of packages, it is intended especially that a substance that improves the barrier properties of the workpiece be deposited by the plasma.

To promote high practical quality, it is proposed that an adhesion promoter be additionally deposited on a surface of the workpiece to improve the adhesion of the substance.

High productivity can be promoted by simultaneously treating at least two workpieces in a common cavity.

Another area of application consists in the performance of a plasma sterilization as the plasma treatment.

The method can also be used to carry out a surface activation of the workpiece as the plasma treatment.

A design that is compact and can withstand large loads can be achieved by providing the plasma wheel with a supporting ring that has an essentially C-shaped vertical section.

An especially low position of the center of mass is achieved by arranging the delivery device on a base leg of the supporting ring.

A modular basic design with good accessibility of the individual functional components is provided by arranging the plasma stations on a terminal leg of the supporting ring.

Specific embodiments of the invention are schematically illustrated in the drawings.

FIG. 7 shows the same view as in FIG. 5 but with the plasma chamber open.

FIG. 8 shows a vertical section along cross-sectional line VIII-VIII in FIG. 7.

Figure 1:
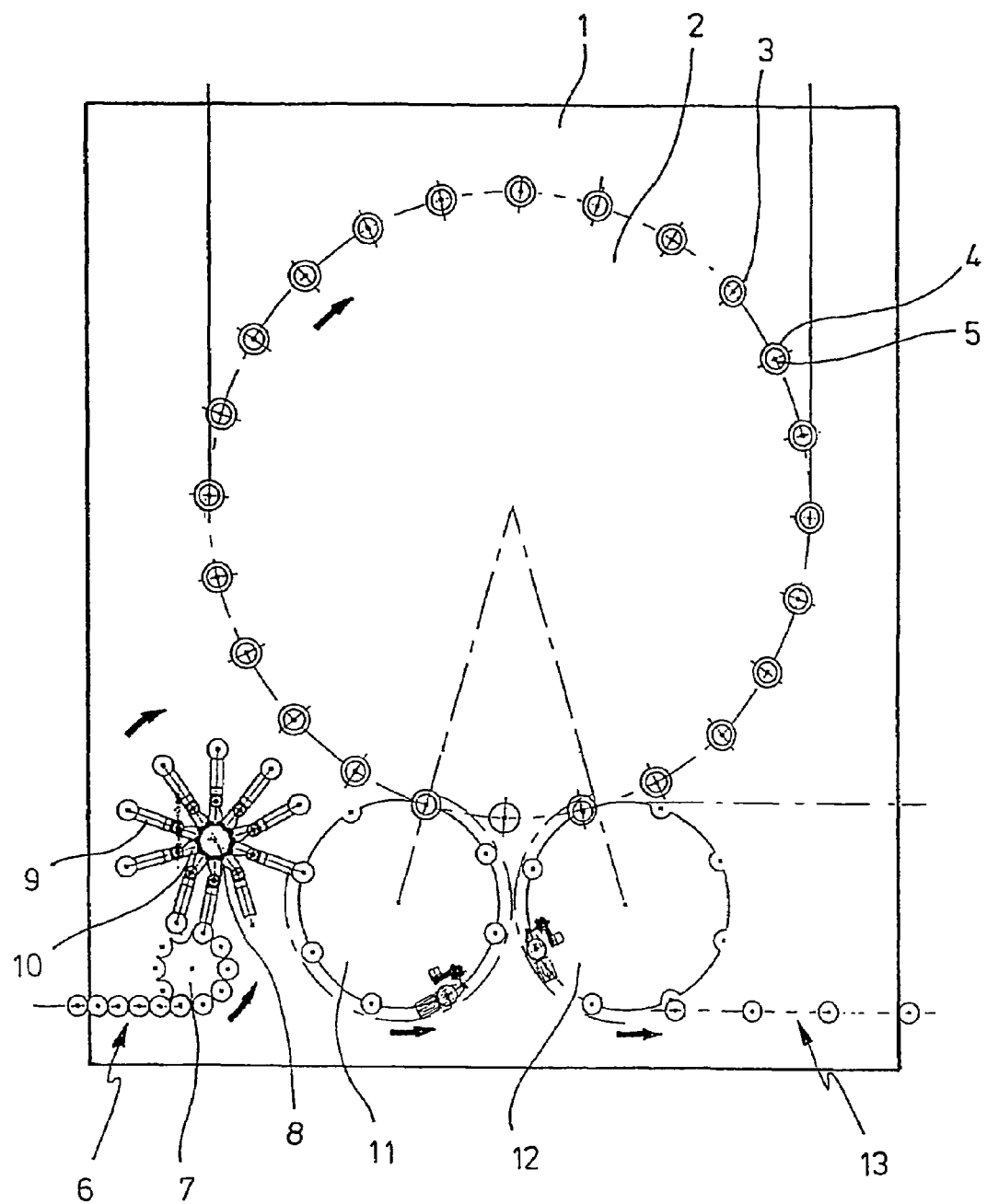
FIG. 1 shows a schematic diagram of a plurality of plasma chambers, which are arranged on a rotating plasma wheel, which is coupled with input and output wheels.

The view in FIG. 1 shows a plasma module (1), which is provided with a rotating plasma wheel (2). A plurality of plasma stations (3) is arranged along the circumference of the plasma wheel (2). The plasma stations (3) are provided with cavities (4) and plasma chambers (17) for holding the workpieces (5) that are to be treated.

The workpieces to be treated (5) are fed to the plasma module (1) in the region of an input (6) and further conveyed by an isolating wheel (7) to a transfer wheel (8), which is equipped with positionable support arms (9). The support arms (9) are mounted in such a way that they can be swiveled relative to a base (10) of the transfer wheel (8), so that the spacing of the workpieces (5) relative to one another can be changed. In this way, the workpieces (5) are transferred from the transfer wheel (8) to an input wheel (11) with increased spacing of the workpieces (5) relative to one another compared to the isolating wheel (7). The input wheel (11) transfers the workpieces (5) to be treated to the plasma wheel (2). After the treatment has been carried out, the treated workpieces (5) are removed from the area of the plasma wheel (2) by an output wheel (12) and transferred to the area of an output line (13).

Figure 2:
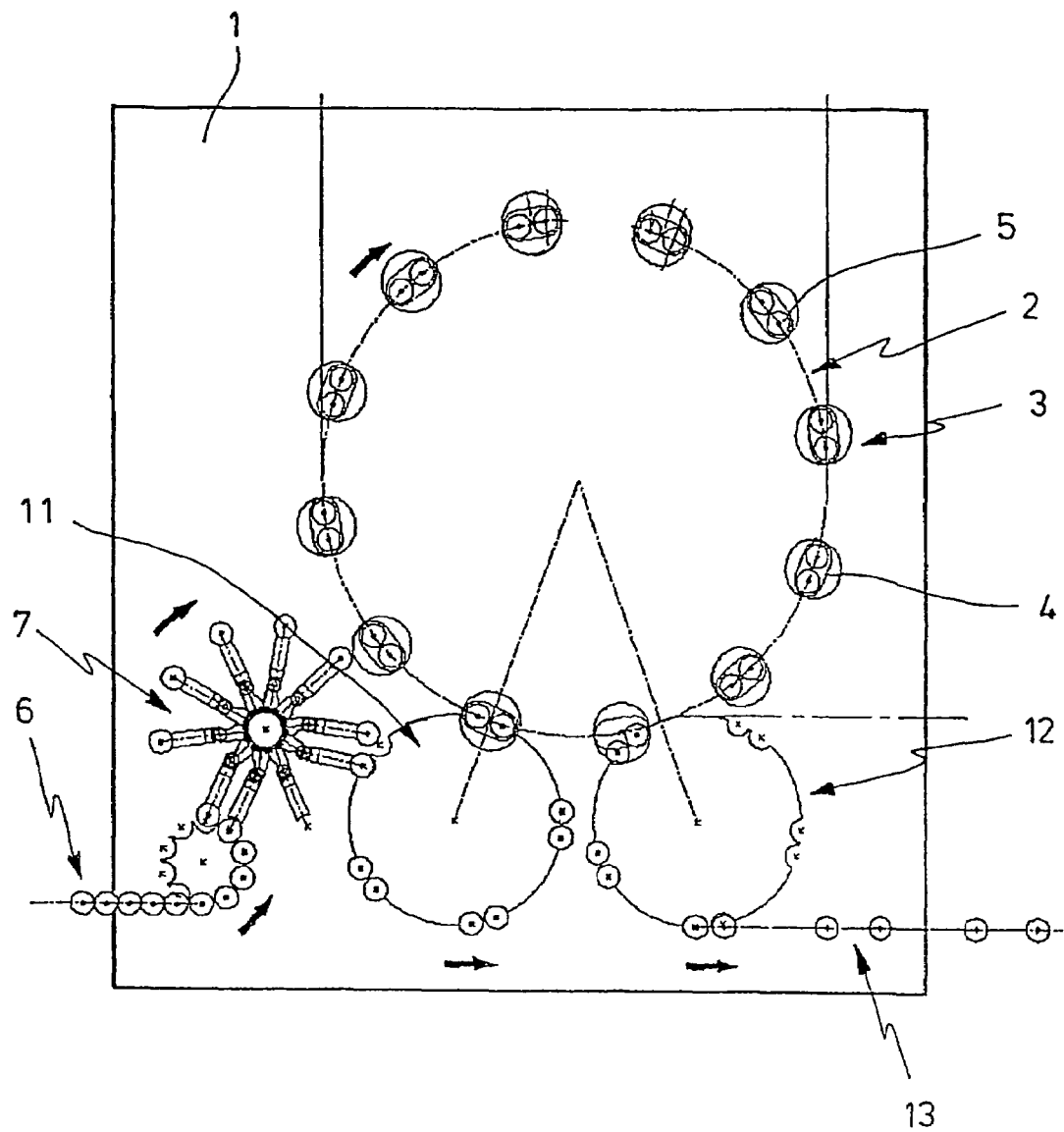
FIG. 2 shows an arrangement similar to FIG. 1, in which each plasma station is equipped with two plasma chambers.

In the embodiment shown in FIG. 2, each plasma station (3) is equipped with two cavities (4) and plasma chambers (17). This makes it possible to treat two workpieces (5) at a time. In this connection, it is basically possible to design the cavities (4) completely separate, but it is also basically possible to separate only sections of a common cavity space from each other in such a way that optimum coating of all workpieces (5) is ensured. In particular, it is intended here that the cavity sections be separated from each other at least by separate microwave couplings.

Figure 3:
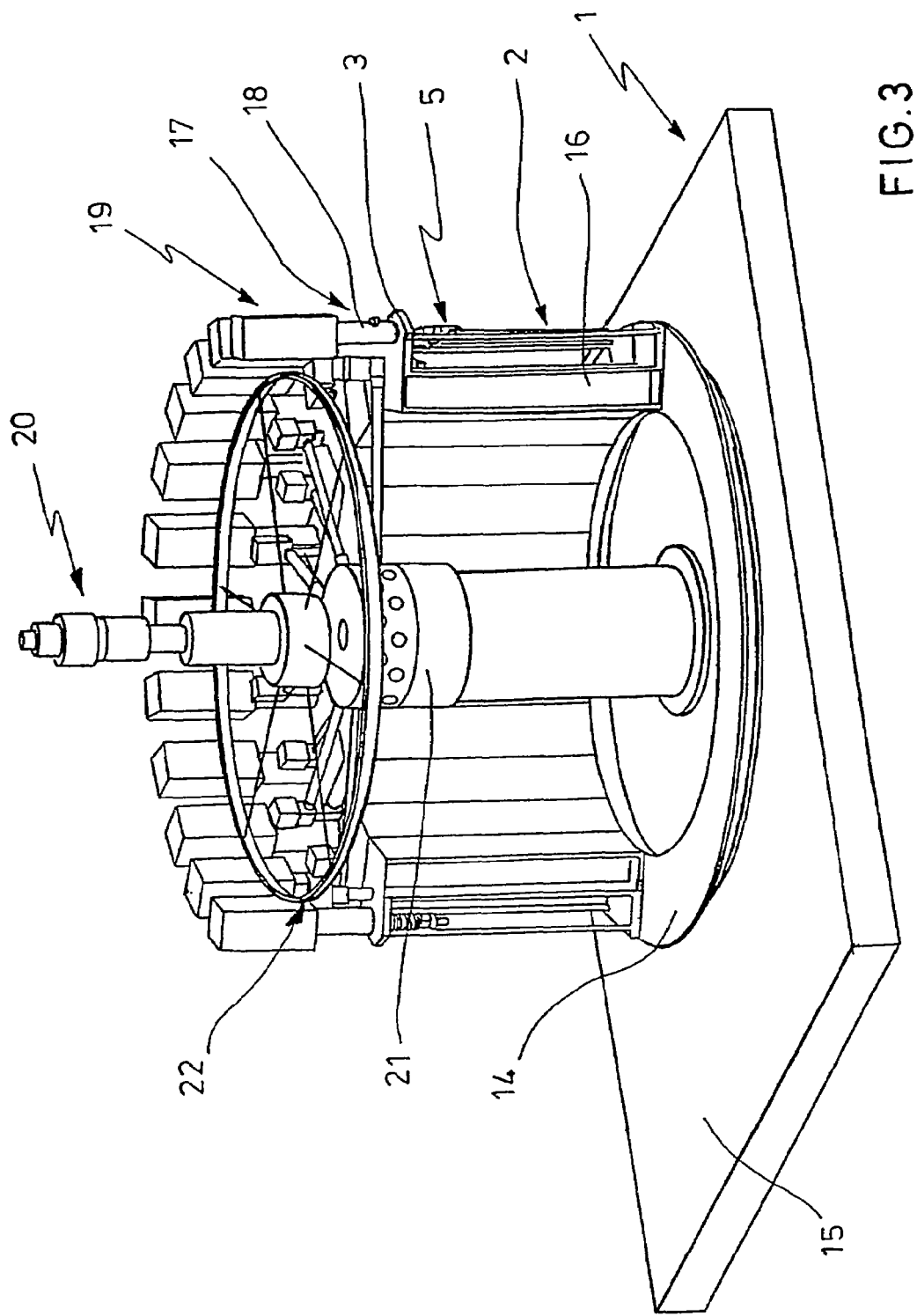
FIG. 3 shows a perspective view of a plasma wheel with a plurality of plasma chambers.

FIG. 3 shows a perspective view of a plasma module (1) with a partially assembled plasma wheel (2). The plasma stations (3) are installed on a supporting ring (14), which is designed as part of a revolving joint and is mounted in the area of a machine base (15). Each plasma station (3) has a station frame (16), which supports plasma chambers (17). The plasma chambers (17) have cylindrical chamber walls (18) and microwave generators (19).

A rotary distributor (20), by which the plasma stations (3) are supplied with operating agents and power, is located in the center of the plasma wheel (2). Especially ring conduits (21) can be used for distribution of the operating agents.

The workpieces (5) to be treated are shown below the cylindrical chamber walls (18). For the sake of simplicity, lower parts of the plasma chambers (17) are not shown in the drawing.

Figure 4:
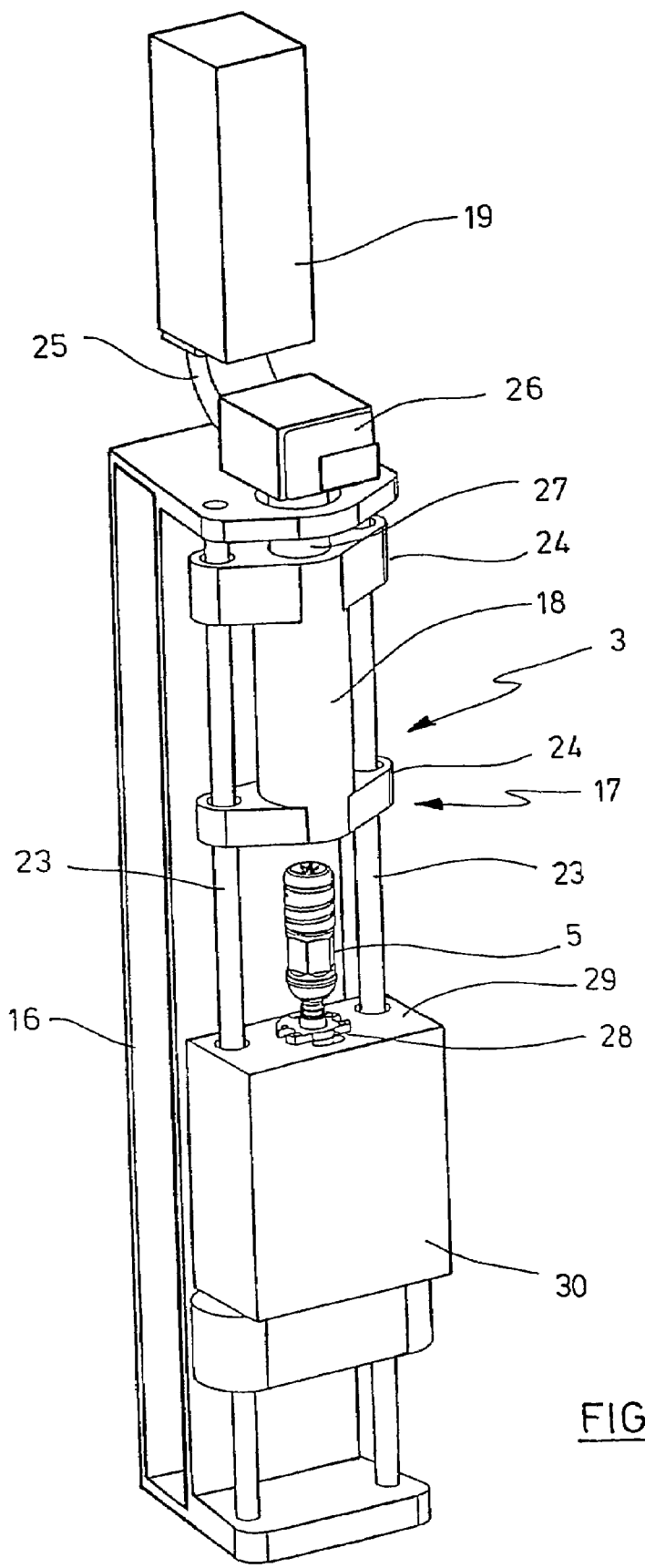
FIG. 4 shows a perspective view of a plasma station with one cavity.

FIG. 4 shows a perspective view of a plasma station (3). The drawing shows that the station frame (16) is provided with guide rods (23), on which a slide (24) for mounting the cylindrical chamber wall (18) is guided. FIG. 4 shows the slide (24) with the chamber wall (18) in its raised position, so that the workpiece (5) is exposed.

The microwave generator (19) is located in the upper region of the plasma station (3). The microwave generator (19) is connected by a guide (25) and an adapter (26) to a coupling duct (27), which opens into the plasma chamber (19). Basically, the microwave generator (19) can be installed directly in the vicinity of the chamber lid (31) or coupled with the chamber lid (31) at a predetermined distance from the chamber lid (31) via a spacing element and thus installed in a larger surrounding area of the chamber lid (31). The adapter (26) acts as a transition element, and the coupling duct (27) is designed as a coaxial conductor. A quartz glass window is installed in the area of the opening of the coupling duct (27) into the chamber lid (31). The guide (25) is designed as a waveguide.

The workpiece (5) is positioned in the area of a sealing element (28), which is located in the vicinity of the chamber floor (29). The chamber floor (29) is formed as part of a chamber base (30). To facilitate adjustment, it is possible to mount the chamber base (30) in the area of the guide rods (23). An alternative is to mount the chamber base (30) directly on the station frame (16). In an arrangement of this type, it is also possible, for example, to design the guide rods (23) in two parts in the vertical direction.

Figures 5, 6:
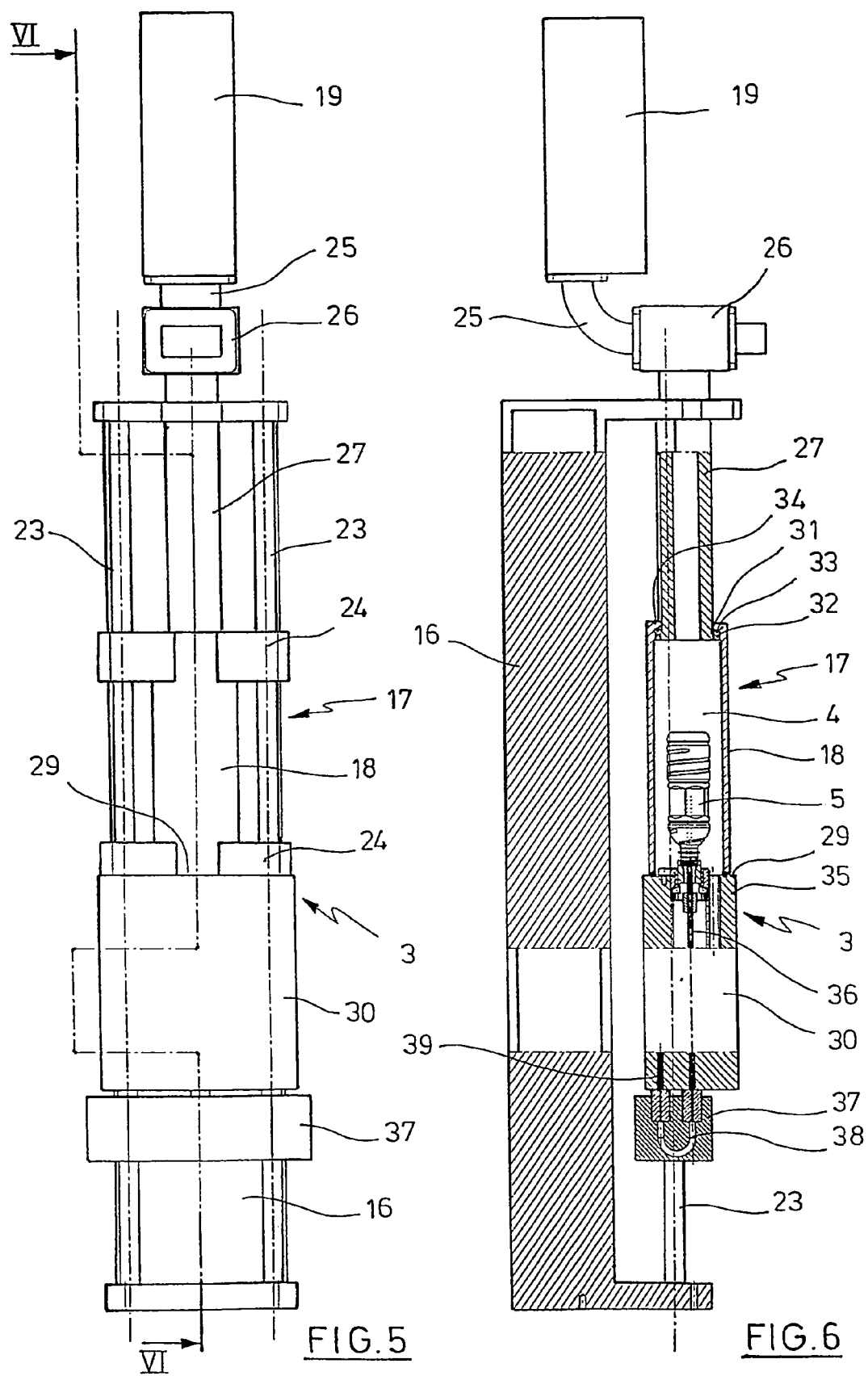
FIG. 5 shows a front elevation of the device in FIG. 4 with the plasma chamber closed.
FIG. 6 shows a cross section along cross-sectional line VI-VI in FIG. 5.

FIG. 5 shows a front elevation of the plasma station (3) of FIG. 3 with the plasma chamber (17) closed. The slide (24) with the cylindrical chamber wall (18) is lowered here relative to the position in FIG. 4, so that the chamber wall (18) is moved against the chamber floor (29). In this position, the plasma coating can be carried out.

FIG. 6 shows a vertical sectional view of the arrangement in FIG. 5. It is especially apparent that the coupling duct (27) opens into a chamber lid (31), which has a laterally projecting flange (32). A seal (33), which is acted upon by an inner flange (34) of the chamber wall (18), is located in the area of the flange (32). When the chamber wall (18) is lowered, the chamber wall (18) becomes sealed relative to the chamber lid (31). Another seal (35) is located in the lower region of the chamber wall (18) to ensure sealing relative to the chamber floor (29).

In the position shown in FIG. 6, the chamber wall (18) encloses the cavity (4), so that both the interior of the cavity (4) and the interior of the workpiece (5) can be evacuated. To assist with the introduction of process gas, a hollow lance (36) is mounted in the area of the chamber base (30) and can be moved into the interior of the workpiece (5). To allow positioning of the lance (36), the lance is supported by a lance slide (37), which can be positioned along the guide rods (23). A process gas channel (38) runs inside the lance slide (37). In its raised position shown in FIG. 6, the process gas channel (38) is coupled with a gas connection (39) of the chamber base (30). This arrangement eliminates hose-like connecting elements on the lance slide (37).

FIGS. 7 and 8 show the arrangement of FIGS. 5 and 6 with the chamber wall (18) in its raised position. When the chamber wall (18) is positioned in this way, the treated workpiece (5) can be removed from the area of the plasma station (3) without any problems, and a new workpiece (5) to be treated can be inserted. Alternatively to the positioning of the chamber wall (18) that is shown in the drawing, with the plasma chamber (17) in an open state produced by upward movement of the chamber wall (18), it is also possible to perform the opening operation by moving a structurally modified, sleeve-like chamber wall vertically downward.

In the illustrated embodiment, the coupling duct (27) has a cylindrical shape and is arranged essentially coaxially with the chamber wall (18).

Figure 9:
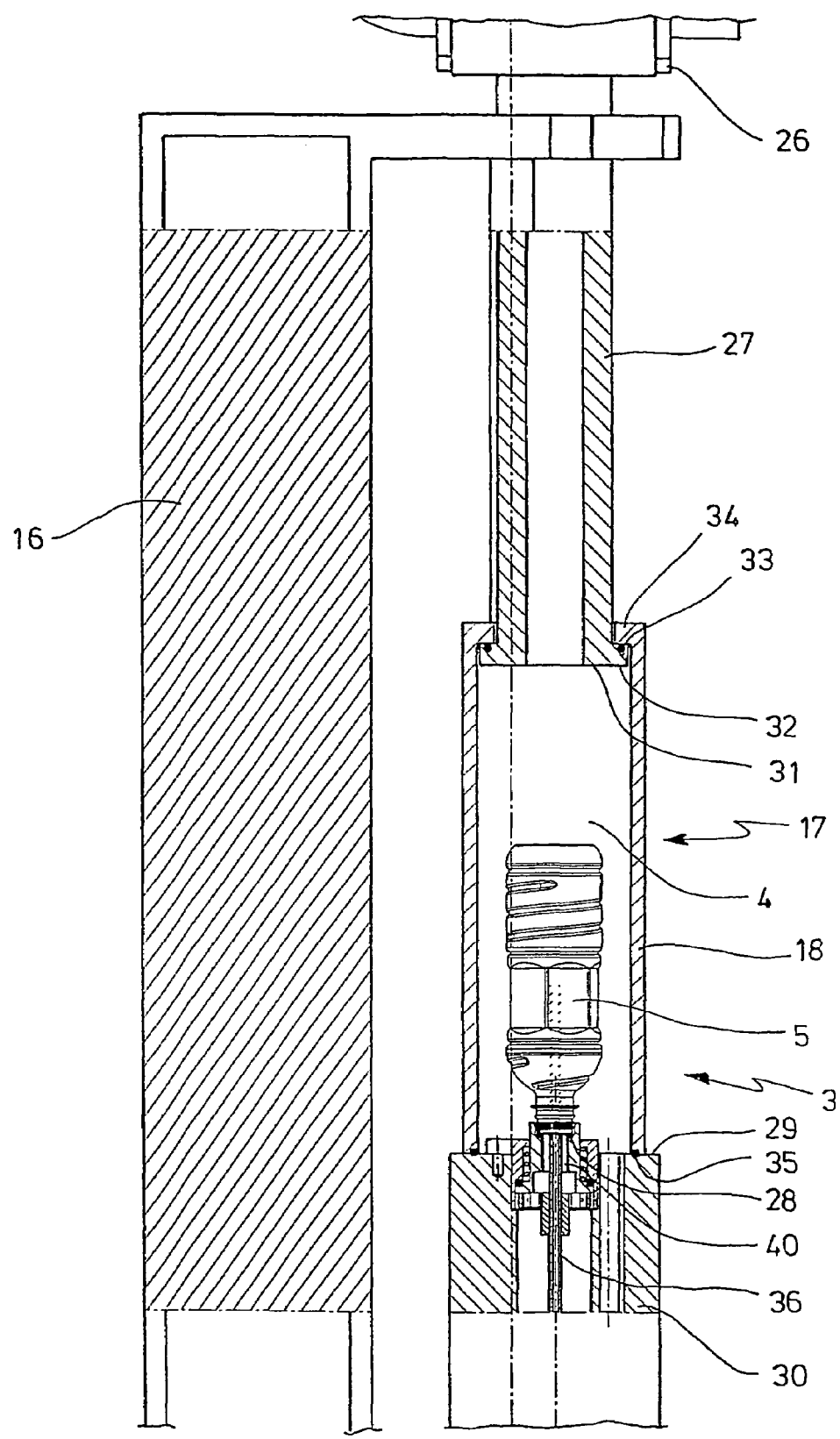
FIG. 9 shows an enlarged view of the plasma chamber with a bottle to be coated in accordance with FIG. 6.

FIG. 9 shows a vertical section in accordance with FIG. 6 in an enlarged partial view of the area around the chamber wall (18). Especially evident in the drawing are the overlapping of the inner flange (34) of the chamber wall (18) over the flange (32) of the chamber lid (31) and the mounting of the workpiece (5) by the mounting element (28). Furthermore, the drawing shows that the lance (36) passes through a hollow space (40) in the mounting element (28).

Figure 10:
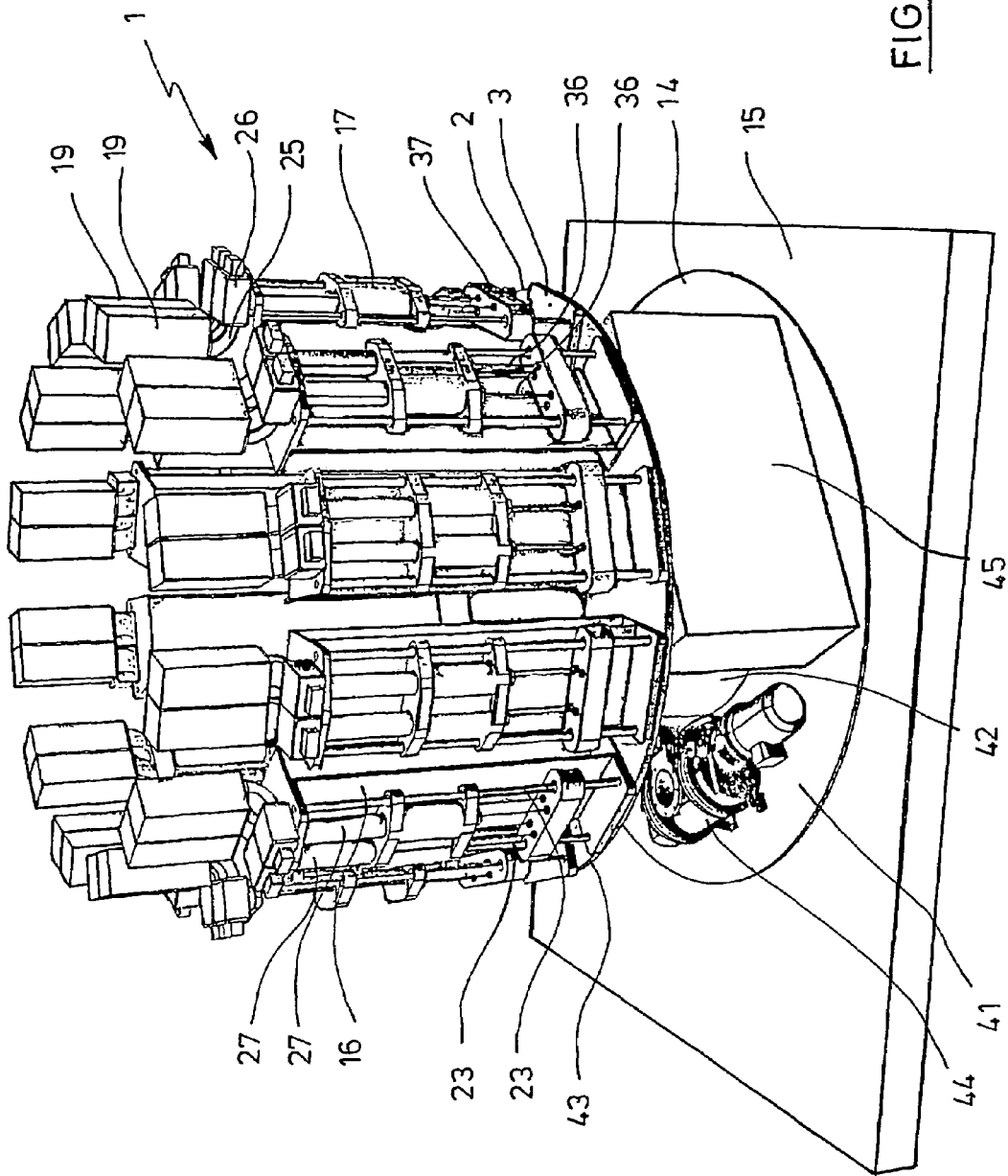
FIG. 10 shows a perspective view of a support device, which has pumps for operating agents arranged on a rotating plasma wheel as well as plasma stations, which have two plasma chambers each and are likewise arranged on the plasma wheel.

FIG. 10 shows a plasma module (1) that is modified compared to the view in FIG. 3. The plasma wheel (2) is designed here for the rotating transport of plasma stations (3), each of which has two plasma chambers (17). Each of the plasma stations (3) has two microwave generators (19), two guides (25), and two adapters (26), which introduce the microwaves into each of the associated plasma chambers (17) through coupling ducts (27) to ignite the plasma. The supporting ring (14) of the plasma wheel (2) has a C-shaped profile in a vertical cross section, with a base leg (41), a spacing leg (42), and a terminal leg (43). The spacing leg (42) runs essentially vertically, and the base leg (41) and the terminal leg (43) are arranged essentially horizontally. The base leg (41) and the terminal leg (43) extend radially outward from the spacing leg (42).

The plasma stations (3) are arranged vertically above the terminal leg (42). In the embodiment shown in FIG. 10, delivery devices (44) for an operating agent are installed on the base leg (41). The operating agent is supplied to the plasma stations (3). In the illustrated embodiment, the delivery device (44) is realized as a vacuum pump. In addition to the delivery devices (44), distribution cabinets (45) for the electric power supply of the plasma stations (3) are installed on the base leg (41). In this regard, the delivery devices (44) and the distribution cabinets (45) are installed inside the holding space made available by the C-shaped vertical section of the supporting ring (14).

During rotation of the plasma wheel (2), the arrangement described above causes the delivery devices (44) and the distribution cabinets (45) to rotate together with the plasma stations (3), and there is no relative movement between these assemblies. Suitable connecting lines can thus be realized in a simple way.

Figure 11:
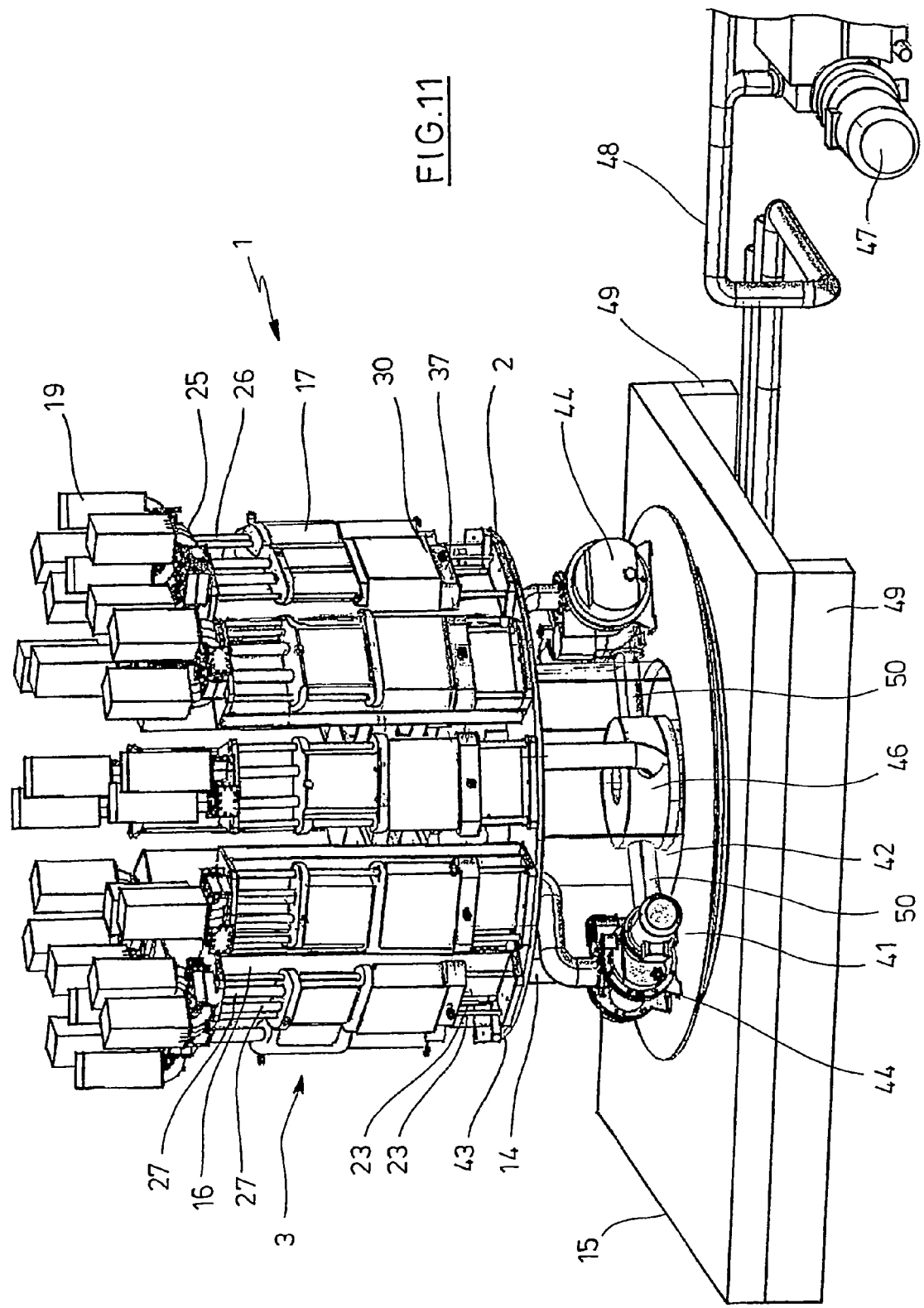
FIG. 11 shows another, partially transparent, view of a plasma wheel similar to FIG. 10 without the distribution box.

FIG. 11 shows a plasma module (1) that is slightly modified from the drawing in FIG. 10 in a different view and with a partially altered representation of the individual parts. The microwave generators (19) are positioned differently from the drawing in FIG. 10. In addition, the chamber bases (30) are drawn in between the lance slides (37) and the plasma chambers (17) in FIG. 11. Especially control valves for supplying the plasma chambers (17) with operating agents can be installed in the area of the chamber bases (30).

The distribution cabinets (45) are not shown in FIG. 11, so that it is possible to look into the center of the plasma wheel (2). The drawing shows that a revolving turret (46) is installed approximately at the height level of the delivery devices (44). The revolving turret (46) serves to connect the delivery devices (44) with external delivery devices (47). When the plasma stations (3) are operated with three different negative pressures, namely, a first negative pressure, a second negative pressure that is lower than the first negative pressure, and a process negative pressure, the revolving turret (46) is realized as a revolving three-way vacuum inlet. Connection of the revolving turret (46) to the external delivery devices (47) can be accomplished in a simple way by connecting pipes (48), which run partially below the machine base (15). For this purpose, the machine base (15) has support elements (49), which provide installation space below the machine base (15) by providing vertical spacing between the machine base (15) and a mounting surface.

The revolving turret (46) is connected by lines (50) with the associated delivery devices (44). In the drawing in FIG. 11, the spacing leg (42) is shown partially transparent, so that the path of the lines (50) can be seen.

Figure 12:
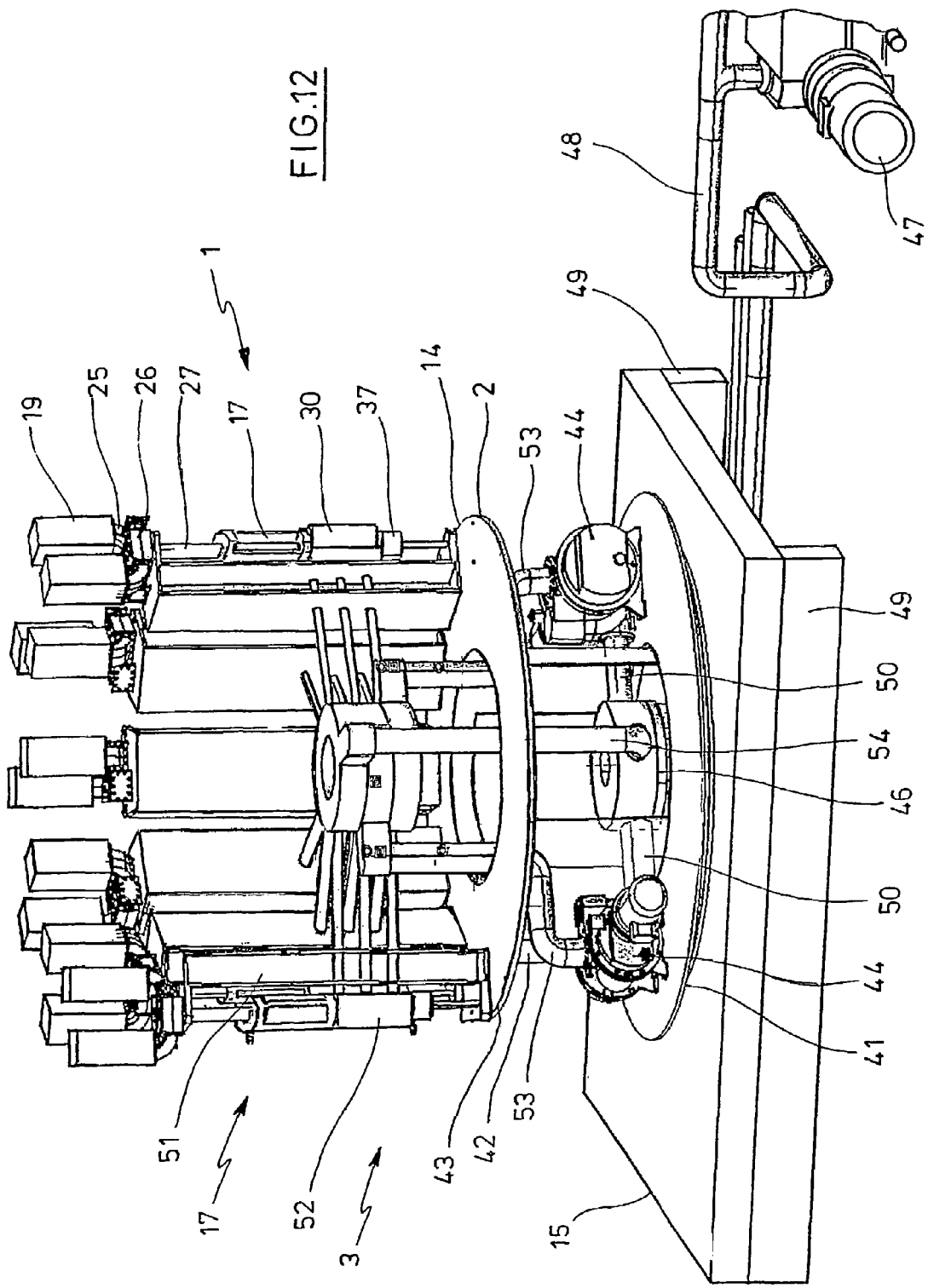
FIG. 12 shows the plasma wheel of FIG. 11 in a partially assembled state.

FIG. 12 shows the arrangement of FIG. 11 in a partially assembled state. In particular, it shows that a distributor (51) is arranged at a height level similar to the height level of the plasma chambers (17). In the illustrated embodiment, the distributor (51) is realized as a three-way distributor. To this end, the distributor (51) has three distribution segments arranged vertically one above the other. The distribution segments are each connected with the plasma chambers (17) by connecting lines (52). In the illustrated embodiment, two operating agents are each supplied to the distributor (51) by a delivery device (44). To this end, the delivery devices (44) are connected with the distributor (51) by connecting lines (53). An additional operating agent is supplied to the distributor (51) directly from the revolving turret (46) by an ascending line (54).

Figure 13:
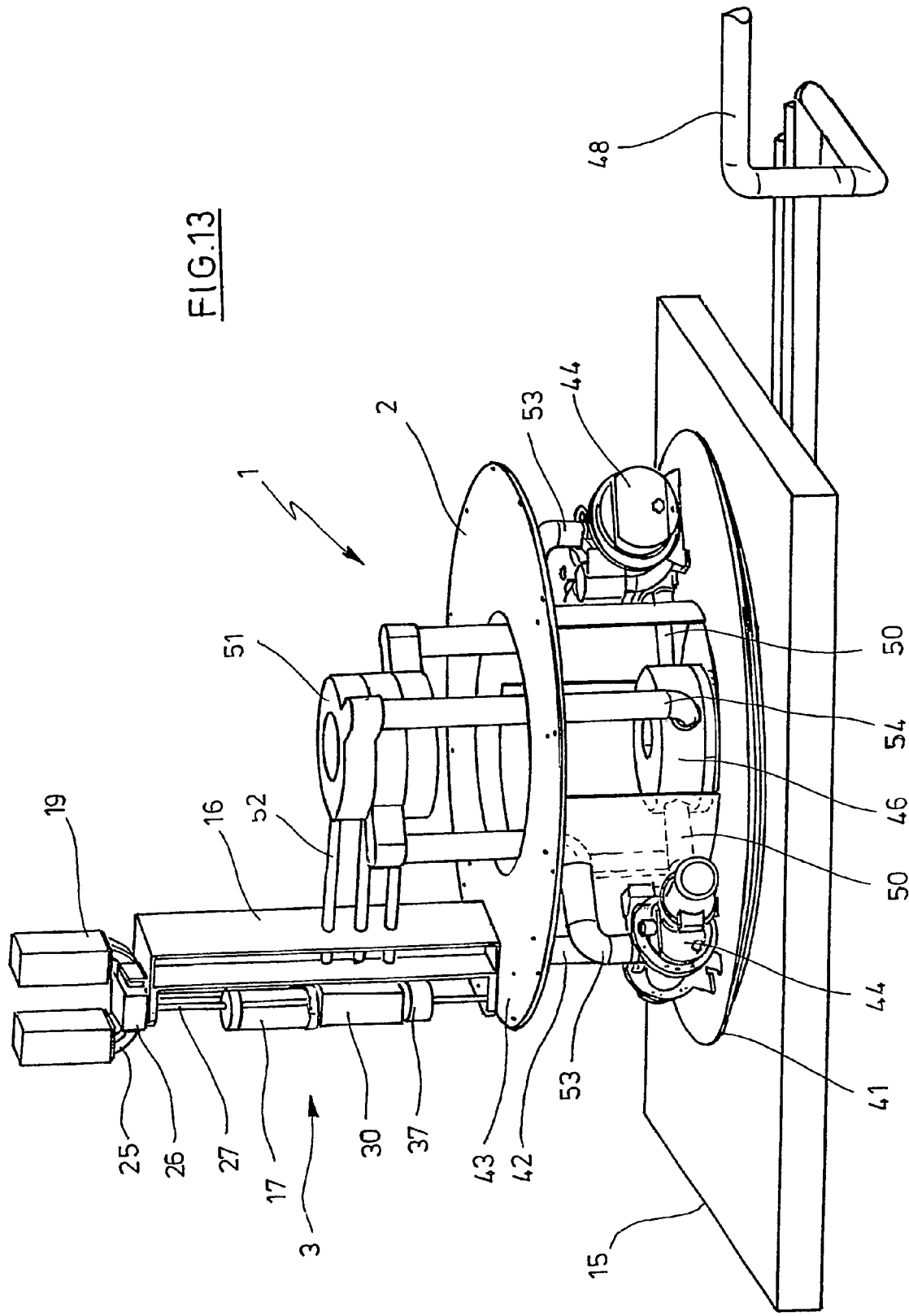
FIG. 13 shows the plasma wheel of FIG. 11 with only one plasma station installed.

For further explanation, FIG. 13 shows the arrangement according to FIG. 12 with only one plasma station illustrated. In particular, the drawing shows the arrangement of the three segments of the ventilator (51) vertically one above the other and the path of the connecting lines (48) between the distributor (51) and the chamber base (30). The connecting lines (52) are guided directly to valves arranged in the area of the chamber base (30). In particular, FIG. 13 also illustrates that the distributor (51) is supported by the lines (52, 53) in the illustrated embodiment. This provides good accessibility. However, it is also possible to use additional supporting elements.

Figure 14:
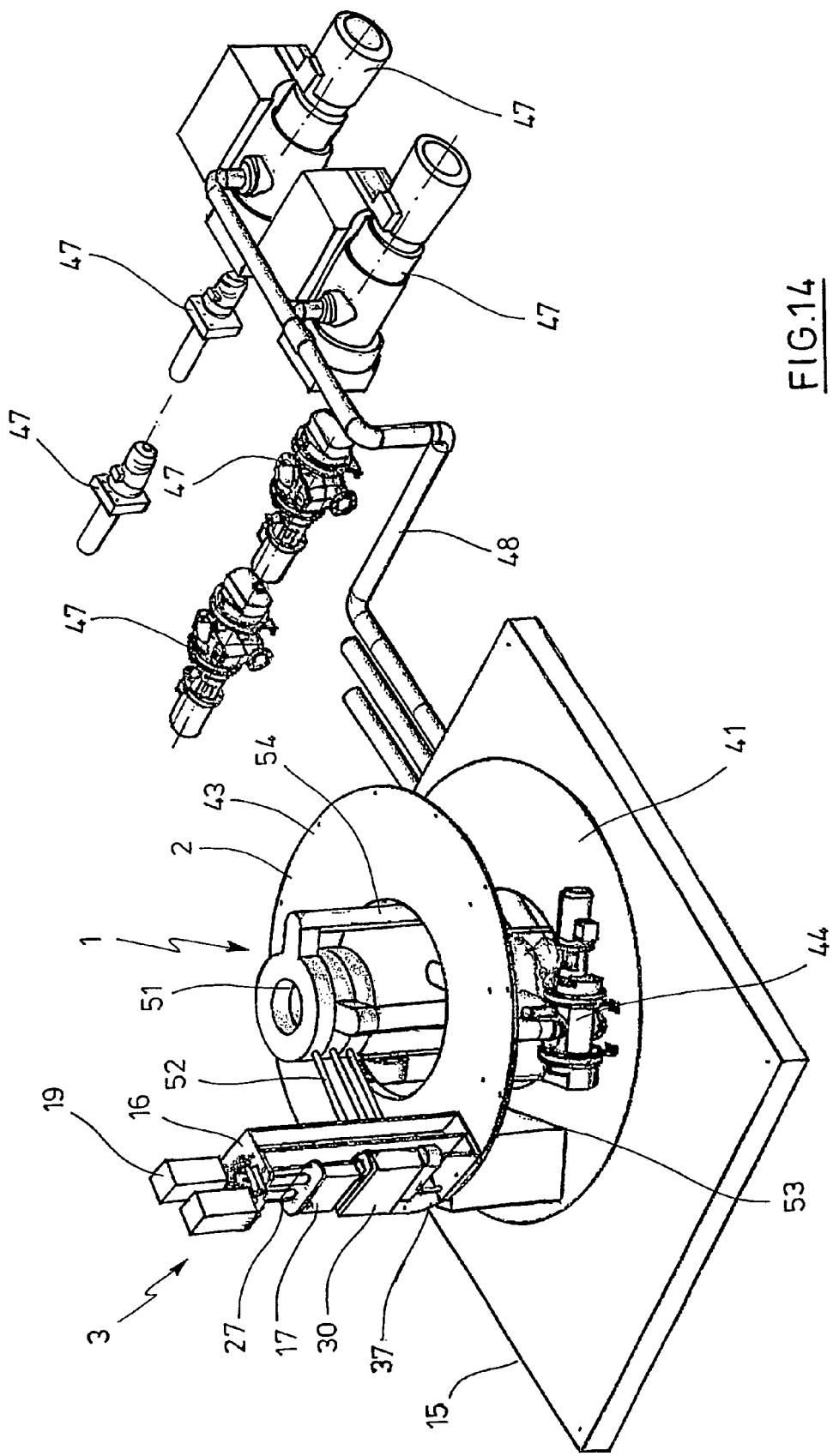
FIG. 14 shows the plasma wheel of FIG. 13 in a different perspective view and shows external delivery devices for operating agents.

FIG. 14 shows the arrangement according to FIG. 13 in a different perspective view and with six external delivery devices (47) assigned to it. In this connection, two external delivery devices (47) are assigned to each vacuum level. In the illustrated embodiment, the delivery devices (47) for the first vacuum level provide a negative pressure on the order of 30-50 mbars. This negative pressure is made available to the plasma stations (3) in the illustrated embodiment without additional conveyance devices (44) on the plasma wheel (2) directly through the revolving turret (46). The negative pressures for the other external delivery devices (47) are preset as a function of the given process requirements. In particular, a pressure range on the order of 1-10 mbars is intended. Rotary sliding-vane vacuum pumps, Roots vacuum pumps, or designs combined from these types of pumps can be used as delivery devices (44, 47). In a preferred embodiment, Roots vacuum pumps are used as the delivery devices (44) installed on the plasma wheel (2), and rotary sliding-vane vacuum pumps are used as the external delivery devices (47).

To avoid unnecessarily long connecting pipes (48), it is especially intended that the external delivery devices (47) be positioned adjacent to the plasma module (1). To this end, it is possible, for example, to use a special preliminary stage module. The required external delivery devices (47) can be arranged inside such a preliminary stage module, which can be equipped with standardized connections for connection to the plasma module (1). This greatly simplifies both assembly and the subsequent start-up operation.

In the embodiment shown in FIG. 14, the two external delivery devices (47) for the first vacuum level are connected in parallel relative to each other. On the other hand, the other external delivery devices (47) for the second vacuum level, which operates at a lower pressure level than the first vacuum level, and for the third vacuum level for maintaining the negative pressure while the treatment is being carried out, are connected in series. This takes into account the fact that the primary concern in the production of the relatively higher negative pressure is to evacuate a relatively large volume, whereas in the case of the other two vacuum levels at lower pressure than the first vacuum level, the primary concern is to attain the desired low level, which is assisted by the series connection.

Figure 15:
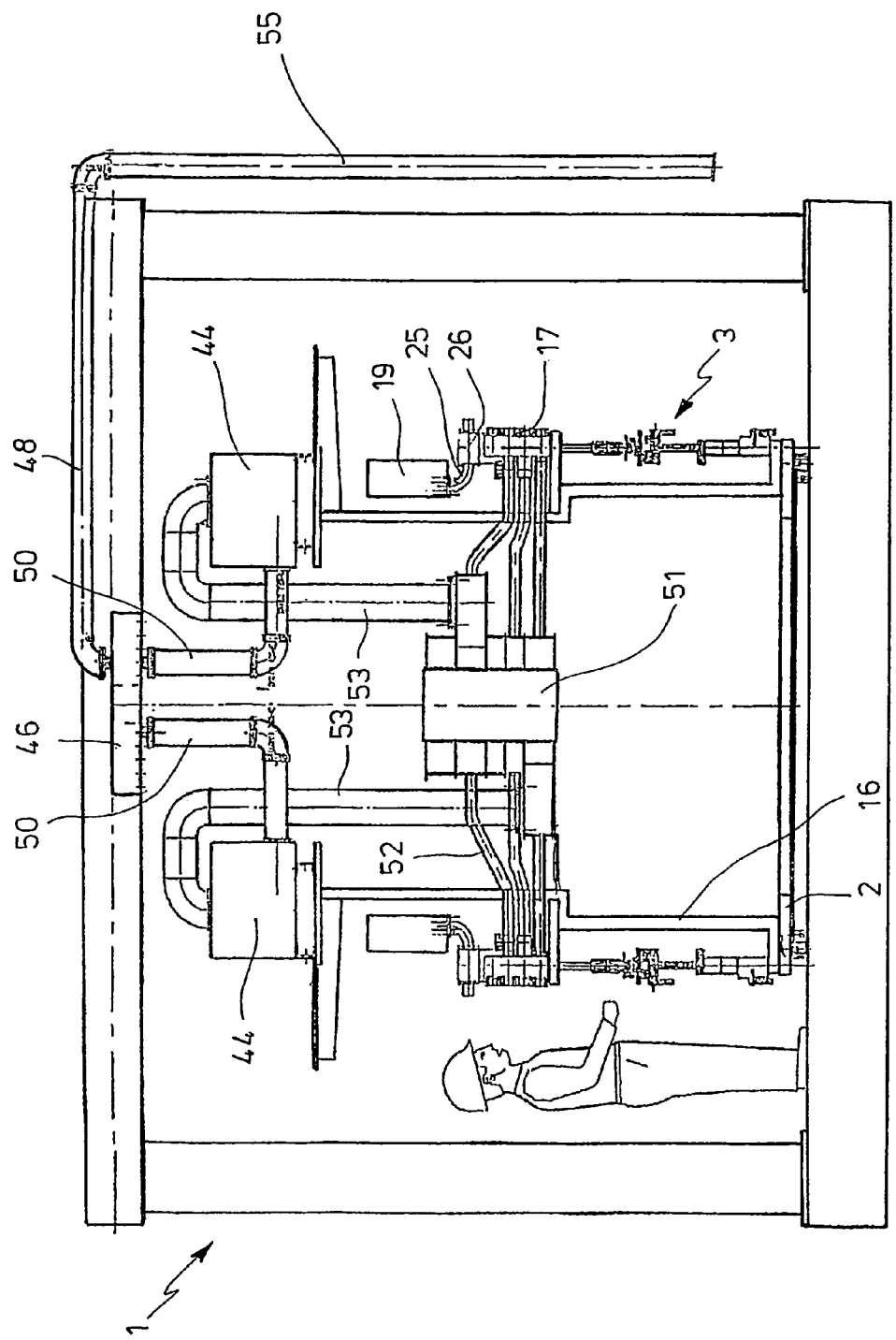
FIG. 15 shows a schematic representation of another plasma wheel, in which delivery devices for operating agents are arranged in a vertically upper area.

FIG. 15 shows an embodiment in which the delivery devices (44) are installed at a higher level than the plasma stations (3). Although this results in a higher center of gravity of the plasma wheel (2), it also provides very good accessibility to the delivery devices (44) during both installation and subsequent service work. In an embodiment of this type, connection with the external delivery devices (44) is preferably accomplished by connecting pipes (48), which initially run above the plasma module (1) and are then connected with the external delivery devices (47) by vertical lines (55). The installation of the delivery devices (44) above the plasma stations (3) makes it possible to arrange the plasma stations (3) at a relatively low level, so that the workpieces (5) to be treated can also be inserted and removed at a relatively low height level.

Figure 16:
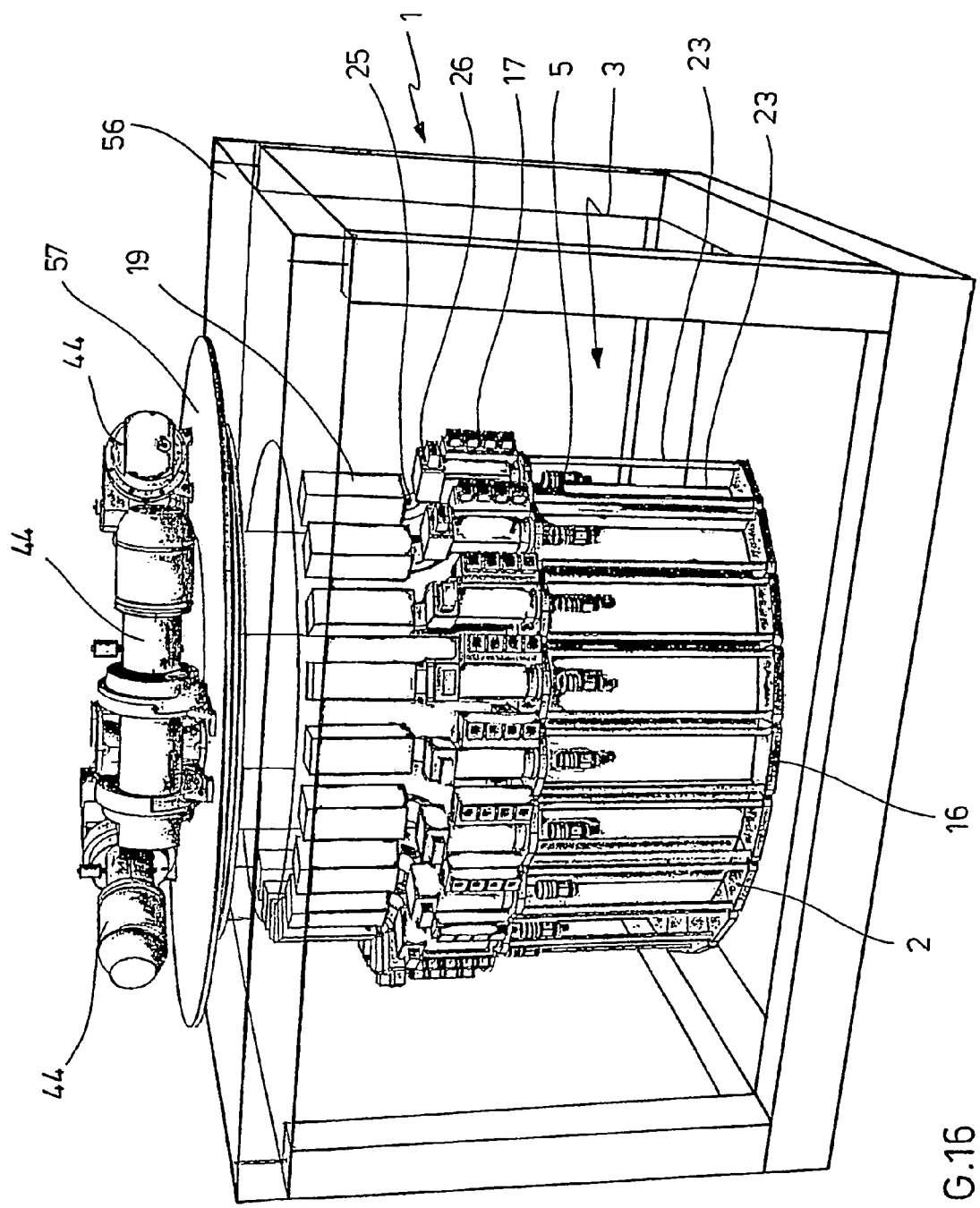
FIG. 16 shows a partial view of another design of a plasma wheel, which has an overhead suspension and in which delivery devices for operating agents are positioned vertically above the plasma stations.

FIG. 16 shows another embodiment of the plasma module (1). In this case, the plasma wheel (2) is suspended in a support frame (56). In contrast to the previously explained embodiments, a pivot bearing (57) of the plasma wheel (2) is thus located vertically above the plasma wheel (2) rather than vertically below the plasma wheel (2). The design of the plasma station (3) can remain basically the same as in the other embodiments. FIG. 16 shows only a partial view of the plasma station (3) without the chamber base (30) and without the lance slide (37) and associated parts.

In an embodiment as shown in FIG. 16, with the use of delivery devices (44) installed on the plasma wheel (2), a relatively low arrangement of the plasma chambers (17) can also be retained. In the specific embodiment illustrated here, three delivery devices (44) are positioned on the plasma wheel (2). Relative to a pivot bearing (57) supported by the support frame (56), the plasma stations (3) are installed below the pivot bearing (57), and the delivery devices (44) are installed above the pivot bearing (57). As a result of this arrangement of the pivot bearing (57) at a high level, a high degree of structural stability can be provided, despite the arrangement of the delivery devices (44) at a high level.

A typical treatment operation is explained below for the example of a coating operation and is carried out in such a way that the workpiece (5) is first conveyed to the plasma wheel (2) by means of the input wheel (11), and that the workpiece (5) is inserted into the plasma station (3) with the sleeve-like chamber wall (18) in its raised position. After completion of the insertion operation, the chamber wall (18) is lowered into its sealed position, and then both the cavity (4) and the interior of the workpiece (5) are evacuated, simultaneously at first.

After sufficient evacuation of the interior of the cavity (4), the lance (36) is inserted into the interior of the workpiece (5), and partitioning of the interior of the workpiece (5) from the interior of the cavity (4) is carried out by moving the sealing element (28). It is also possible to start moving the lance (36) into the workpiece (5) synchronously with the start of evacuation of the interior of the cavity. The pressure in the interior of the workpiece (5) is then further reduced. Moreover, it is also possible to carry out the positioning movement of the lance (36) at least partly at the same time as the positioning of the chamber wall (18). After a sufficiently deep negative pressure has been achieved, process gas is introduced into the interior of the workpiece (5), and the plasma is ignited by means of the microwave generator (19). In particular, it is intended that the plasma be used to deposit both an adhesion promoter on the inner surface of the workpiece (5) and the actual barrier layer consisting of silicon oxides. The adhesion promoter can be applied, for example, in a two-stage process before the application of the barrier layer. However, it is also conceivable to use a continuous process to apply at least a portion of the barrier layer even while at least a portion of the adhesion promoter is being applied.

The interior of the plasma chamber (17) and the interior of the workpiece (5) are first evacuated together to a pressure level of about 20 mbars to 50 mbars. The pressure in the interior of the workpiece (5) is then further reduced to about 0.1 mbar. A negative pressure of about 0.3 mbar is maintained during the performance of the treatment operation.

After a coating operation has been completed, the lance (36) is withdrawn from the interior of the workpiece (5), and the plasma chamber (17) and the interior of the workpiece (5) are ventilated. After ambient pressure has been reached inside the cavity (4), the chamber wall (18) is raised again to allow the coated workpiece (5) to be removed and a new workpiece (5) to be inserted for coating. To allow lateral positioning of the workpiece (5), at least part of the sealing element (28) is moved back into the chamber base (3).

Alternatively to the coating of the internal surface of workpieces (5) that was explained above, it is also possible to coat the external surface or to carry out sterilization or surface activation.

The chamber wall (18), the sealing element (28), and/or the lance (36) can be positioned by means of various types of drive equipment. In principle, it is possible to use pneumatic drives and/or electric drives, especially in the form of linear drives. In particular, however, it is also possible to realize a cam mechanism to help achieve exact coordination of motion with the rotation of the plasma wheel (2). For example, the cam mechanism can be designed in such a way that control cams, along which cam followers are driven, are arranged along the circumference of the plasma wheel (2). The cam followers are coupled with the given components that are to be positioned.

The invention claimed is:

1. Device for inner coating containers with a barrier layer, which has at least one plasma chamber, which can be evacuated, for holding the containers, in which the plasma chamber is located in the area of a treatment station, and in which the plasma chamber is bounded by a chamber floor, a chamber lid, and a lateral chamber wall and has at least one mounting element for positioning the container, wherein the plasma chamber (17) is disposed on a rotating plasma wheel and at least one delivery device (44) for an operating agent are arranged on a rotating support device, wherein the rotating support device is situated beneath the rotating plasma wheel, wherein the delivery device (44) is a pump configured to produce a negative pressure and connected to the treatment station, wherein the pump is at a lower height level than the plasma chamber, wherein the treatment station is also connected to a process gas supply that provides the process gas needed to produce the barrier layer.

2. Device in accordance with claim 1, wherein at least two delivery devices (44) for producing different negative pressures are installed on the support device.

3. Device in accordance with claim 1, wherein at least one of the delivery devices (44) is connected to at least one external delivery device (47) for supplying a preconditioned operating agent.

4. Device in accordance with claim 3, wherein at least two external delivery devices (47) are connected in parallel relative to each other.

5. Device in accordance with claim 3, wherein at least two external delivery devices (47) are connected in series relative to each other.

6. Device in accordance with claim 1, wherein the delivery device (44) is connected to an external source of the operating agent by a revolving turret (46).

7. Device in accordance with claim 1, wherein the delivery device (44) is connected to at least two plasma stations (3) by a distributor (51).

8. Device in accordance with claim 7, wherein the distributor (51) is arranged at the same height level as a chamber base (30) of the plasma station (3).

9. Device in accordance with claim 7, wherein the distributor (51) is connected with a chamber base (30) by connecting lines (52) that run essentially radially outward.

10. Device in accordance with claim 9, wherein the distributor (51) has different distribution levels for the distribution of different operating agents.

11. Device in accordance with claim 1, wherein at least two delivery devices (44) are arranged on the support device in an essentially balanced way.

12. Device in accordance with claim 11, wherein delivery devices (44) and distribution cabinets (45) for electrical connections are alternately arranged along the circumference of the support device.

13. Device in accordance with claim 1, wherein the delivery device (44) is installed on a support device designed as a plasma wheel (2).

14. Device in accordance with claim 13, wherein the plasma wheel (2) is designed as a wheel ring.

15. Device in accordance with claim 14, wherein the plasma wheel (2) is provided with a supporting ring (14).

16. Device in accordance with claim 15, wherein the delivery device (44) is installed on a base leg (41) of the supporting ring (14).

17. Device in accordance with claim 15, wherein the treatment stations are installed on a terminal leg (43) of a supporting ring (14).

18. Device in accordance with claim 1, wherein the plasma station (3) is designed for coating a container (5) made of a thermoplastic material.

19. Device in accordance with claim 1, wherein the plasma station (3) is designed for coating a container (5) shaped in the form of a beverage bottle.

20. Device in accordance with claim 1, wherein several cavities (4) are arranged in the area of the treatment station.

21. Device in accordance with claim 1, wherein a chamber wall (18) provided for supplying at least two cavities (4) is arranged in such a way that it can be positioned.

* * * * *